United States Patent [19]
Sun et al.

[11] Patent Number: 5,627,852
[45] Date of Patent: May 6, 1997

[54] SEMICONDUCTOR LASER GEOMETRY FOR BROAD-ANGLE FAR-FIELD ADDRESSING

[75] Inventors: Yan Sun, Stanford; Daniel A. Francis; Stephen A. Biellak, both of Palo Alto; Constance J. Chang-Hasnain, Stanford, all of Calif.

[73] Assignee: The Board of Trustees of the Leland Stanford Junior University, Stanford, Calif.

[21] Appl. No.: 515,859

[22] Filed: Aug. 16, 1995

[51] Int. Cl.$^6$ .............................. H01S 3/19; H01S 3/08
[52] U.S. Cl. ........................ 372/50; 372/24; 372/92
[58] Field of Search .......................... 372/23, 24, 50, 372/92, 36

[56] References Cited

U.S. PATENT DOCUMENTS

| | | | |
|---|---|---|---|
| 5,228,050 | 7/1993 | LaCourse et al. | 372/50 |
| 5,384,797 | 1/1995 | Welch et al. | 372/23 |
| 5,402,436 | 3/1995 | Paoli | 372/50 |
| 5,495,492 | 2/1996 | Toda | 372/45 |
| 5,524,014 | 6/1996 | Kaminous et al. | 372/28 |

*Primary Examiner*—James W. Davie
*Attorney, Agent, or Firm*—Lumen Intellectual Property Services

[57] ABSTRACT

A semiconductor laser apparatus for broad-angle far-field addressing is disclosed. The apparatus comprises a laser block with lasing cavities. The lasing cavity mirrors are made by dry-etching of the semiconductor block. The width of a lasing cavity is defined by a p contact pad on the laser block; further lateral confinement of current to the cavity is achieved by proton implantation followed by etching of the proton layer. The apparatus achieves quasi-continuous beam steering with a total steering angle of 80° and with 11 resolvable spots.

9 Claims, 5 Drawing Sheets

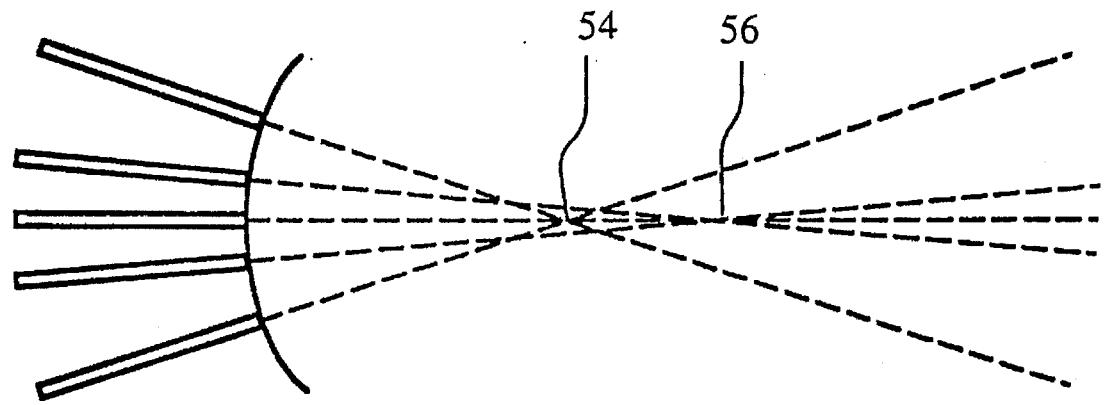
FIG. 8-A
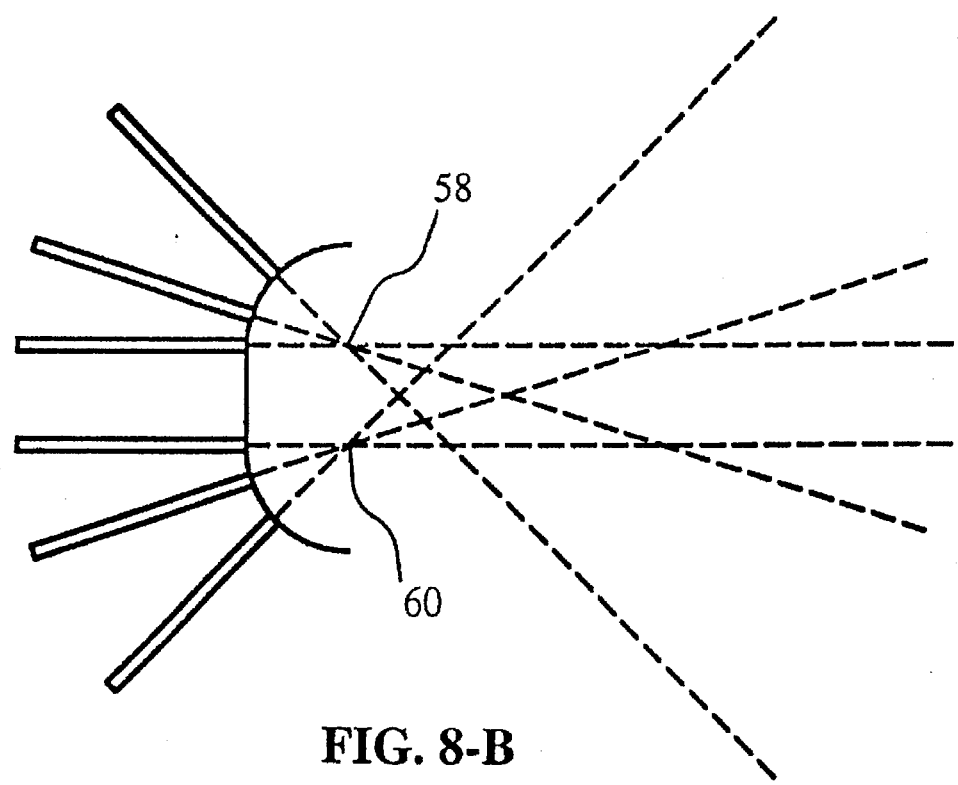
FIG. 8-B

SEMICONDUCTOR LASER GEOMETRY FOR BROAD-ANGLE FAR-FIELD ADDRESSING

This invention was made with Government support under Contract No. ECS 92-57209, awarded by the National Science Foundation, and under grant No. F49620-92-J-0229, awarded by the Air Force Office of Scientific Research. The Government has certain rights in this invention.

BACKGROUND—DESCRIPTION OF PRIOR ART

Beam steering is useful in many areas of science and technology, including the manufacture of laser printers and compact disc players, optical communications, integrated optics and laser radar.

The traditional way to steer laser beams has been through the use of external optics. Mechanical beam steering systems, however, are limited in their speed and mechanical stability. These limitations have led to the development of techniques to integrate the laser source and the steering system on the same chip. The resulting monolithic beam steering systems are compact, fast and mechanically stable.

Two main parameters are used to describe the performance of a beam steering system: the total steering angle, that is, the maximum angle that can be spanned by the laser beam intensity peak, and the number of separable spots in the far field, referred to as resolvable spots.

The original monolithic beam steering techniques have focused on altering the phase front of laser modes inside the laser cavity in order to change the position of the far-field intensity peak. These techniques have included twin-stripe lasers, differentially pumped single waveguide lasers, and Offset Gain and Index Guided (OGIG) lasers. One of the disadvantages of these techniques is that the beam exhibits large modal distortion with power and current variations. In addition, the total steering angle is less than 30°, with five or fewer resolvable spots. As a result of the modal distortion, the far field intensity distributions are not usually single symmetric Gaussian modes. Therefore a significant fraction of the optical power is unusable.

Another system that has been used for multiple spot addressing is the parallel laser array. Parallel laser arrays are suited for the addressing of points spanning rectangular surfaces. Parallel laser arrays, however, can not be used effectively for beam steering, since the total steering angle for such systems is usually very small. Moreover, the total number of laser stripes in parallel arrays is limited by the light-collecting optics and by thermal and electrical crosstalk between the lasers.

OBJECTS AND ADVANTAGES OF THE INVENTION

It is a primary object of the present invention to provide a far-field addressing apparatus which allows much larger steering angles and many more resolvable spots than previous devices. It is another object of this invention to allow beam steering with speeds on the order of 10 GHz, with substantially Gaussian laser beams. These and other objects and advantages will become more apparent after consideration of the ensuing description and the accompanying drawings.

SUMMARY OF THE INVENTION

The objects and advantages of the invention are achieved with a semiconductor laser apparatus comprising a laser block. The laser block contains laser cavities extending radially from a common geometric center. The mirrors delimiting the lasing cavities are dry-etched on the surface of the semiconductor block, and are substantially normal to the lasing cavities. Lasing is induced in a cavity by the application of a voltage between a n contact pad on the bottom of the laser block and a p contact pad on the top of the laser block. The width of a lasing cavity is defined by its p contact pad; further current confinement to the cavity is achieved by proton implantation followed by etching of the proton layer.

BRIEF DESCRIPTION OF THE DRAWINGS

FIG. 6-B shows intensity distributions similar to those shown in FIG. 6-A, for an arrangement where the angular displacement between adjacent cavities is smaller than the far-field spreading angle of a laser beam.

FIG. 6-C shows intensity distributions similar to those shown in FIG. 6-B, for an arrangement where the angular displacement between adjacent cavities is larger than the far-field spreading angle of a laser beam.

FIGS. 8-A and 8-B show two arrangements of lasing cavities.

DESCRIPTION OF THE PREFERRED EMBODIMENTS

Figure 1:
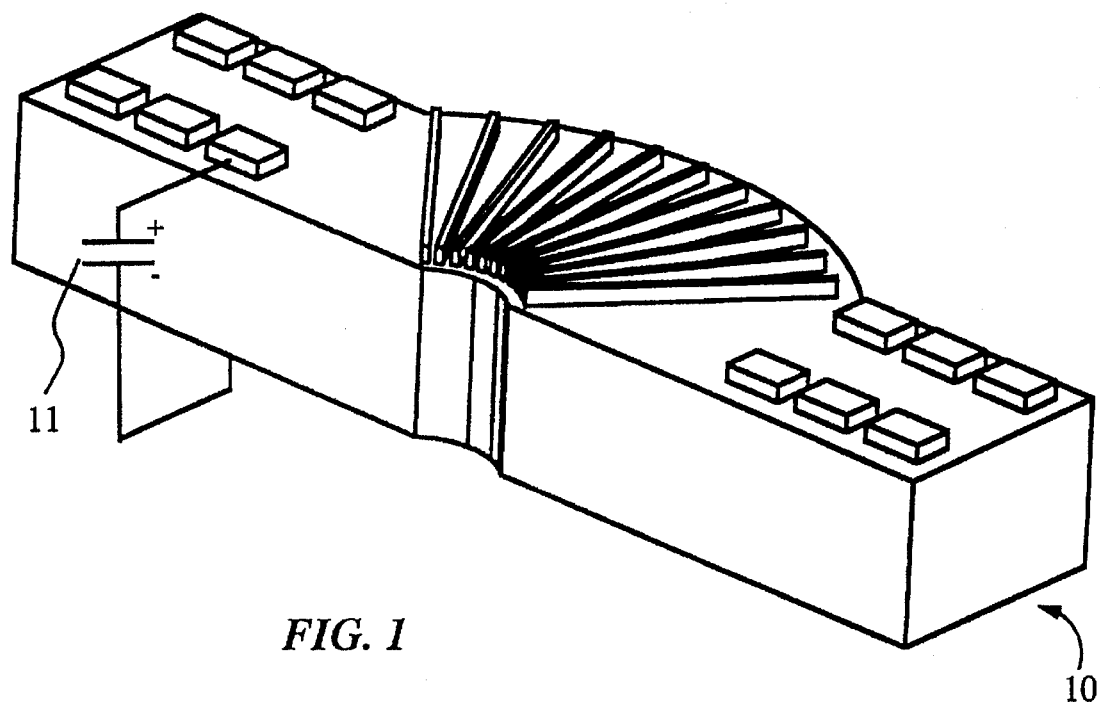
FIG. 1 is a perspective view of a fan-like arrangement of lasing cavities in a laser block, according to the invention.
Figure 2:
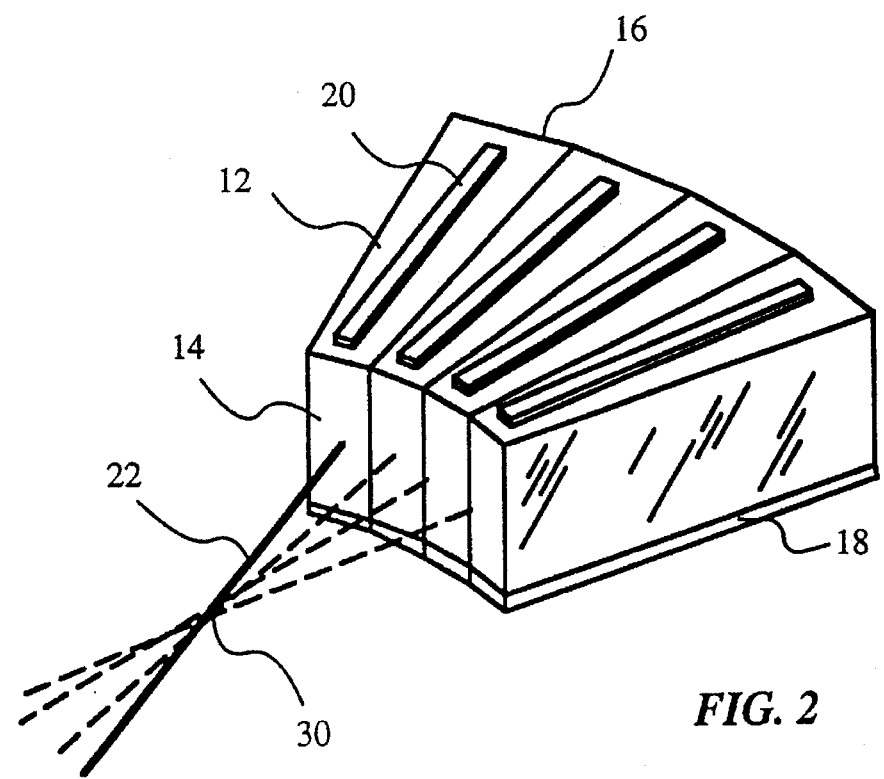
FIG. 2 is a perspective view of some of the lasing cavities in a fan-like arrangement, as shown in FIG. 1.

FIG. 1 shows a laser block 10 and a schematic representation of a power supply 11 used to power the lasers. FIG. 2 shows in more detail a lasing cavity 12. Other lasing cavities are similar to lasing cavity 12 in their internal structure. Lasing cavity 12 is physically defined on two sides by mirrors: a front mirror 14, which serves as the output facet of the laser, and a back mirror 16. What appear in FIG. 1 as curved lines are in fact concatenations of linear segments representing mirrors similar to 14, 16. Two electrical contacts delimit cavity 12 on two other sides: an n contact 18 on the bottom side of the laser block, common to all cavities, and an individual p contact 20 on the top side of the laser block, as shown in FIG. 2. The width of p contact pad 20 defines the width of lasing cavity 12. Further lateral confinement of lasing cavity 12 is achieved by proton implantation followed by etching of the p⁺ layer. In the apparatus described here, a width of 6 μm is chosen for p contact pad 20 in order to produce a far field angular spread of 8° for a laser beam 22.

Figure 3:
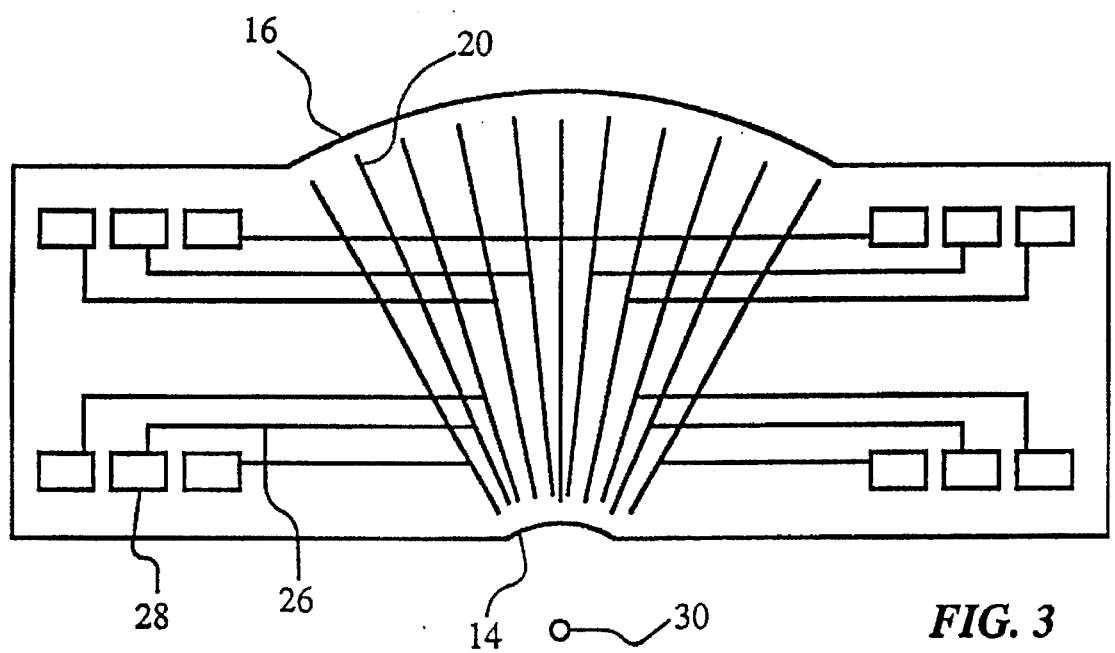
FIG. 3 shows a top view of a fan-like arrangement similar to the one shown in FIG. 1, outlining the electrical connections to the lasing cavities.

A voltage can be applied to p contact pad 20 through a current interconnection 26, as shown in FIG. 3. Interconnection 26 is in electrical communication to a second contact 28, which is in electrical contact to power supply 11.

The semiconductor laser material used in this invention is a graded-index separate confinement heterostructure (GRINSCH) single quantum well (SQW) InGaAs/AlGaAs structure grown by molecule beam epitaxy (MBE). The quantum well active layer is 1.9 μm below the top surface, and the lasing wavelength is 950±5 nm at room temperature.

The p contact pads similar to p contact pad 20 are defined by the application of 6 μm-wide stripes of 200 Å of Ti and 3000 Å of Au on the top side of block 10. Current confinement above the active region is achieved by proton implantation followed by etching of the p⁺ surface. A layer of $Si_3N_4$ with a thickness of 4200 Å is deposited on the laser block to serve both as a mask for mirror etching and as the insulation between the p contact pads similar to contact pad 20 and the current interconnections similar to interconnection 26.

The $Si_3N_4$ is dry etched to form the mirror mask. The mirrors are etched using a $SiCl_4$-based gas mixture to a depth of 2.9 μm into the material, which is about 1 μm below the active layer. Since the quality of the mirrors is critical, the mirrors are always covered with photoresist in the processing steps that follow.

Holes are dry-etched through the insulating layer of $Si_3N_4$ above the p contact pads before the deposition of the current interconnections similar to interconnection 26. The current interconnections are made by depositing 200 Å of Ti and 4000 Å of Au over the insulating layer of $Si_3N_4$, such that the current interconnections are in electrical contact with the p contact pads through the holes in the $Si_3N_4$ layer. The samples are lapped down to 100 μm and polished before the n contact layer deposition. Finally the samples are cleaved between the mirrors of adjacent lasers.

The fabrication of mirrors by etching, as opposed to cleaving, has the advantage that the surface of the mirrors can be made at any angle to the surface of the semiconductor. Mirrors made by etching, however, are not atomically smooth, while those made by cleaving are. Irregularities in the mirror surface lead to greater optical power loss at the surface of etched mirrors than at the surface of cleaved mirrors.

Figure 4:
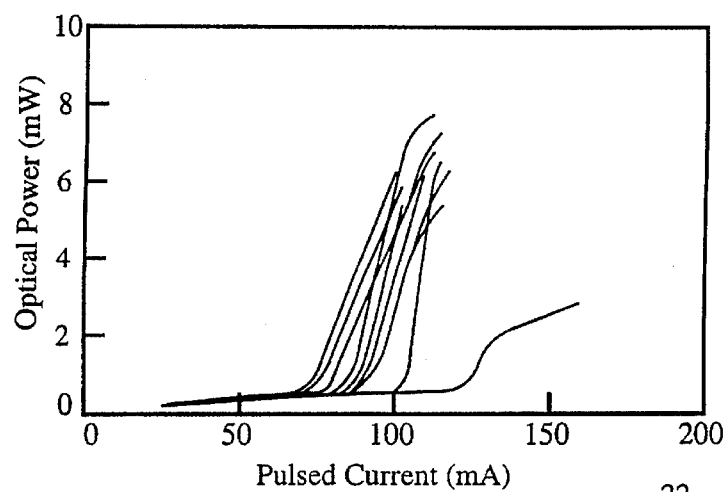
FIG. 4 is a graph illustrating the variation with respect to applied current of the optical power output of 11 laser cavities 310 μm long, according to the invention.

The lasing cavities were tested. In the testing, a voltage is applied between the p contact pads and n contact 18 with a 3 μsec width at a rate of 1 kHz. The output optical power as a function of the applied current is shown in FIG. 4 for 11 lasing cavities of length 310 μm. The lasing thresholds are typically between 80 mA and 120 mA with the lowest around 70 mA. Cleaved-mirror lasers of comparable cavity length manufactured with more refined proton implantation techniques than the one used here operate with 60 mA thresholds. The comparatively high thresholds of the lasers described here are attributed to the lower quality of the mirror surfaces and to poor current confinement above the active region.

One practical geometrical arrangement is to have some or all lasing cavities oriented toward a geometric center 30, as shown in FIG. 2 and 3. In the fan-like arrangement shown in FIG. 1–3, center 30 is outside laser block 10. All laser beams appear from far away as originating from center 30.

Figure 5:
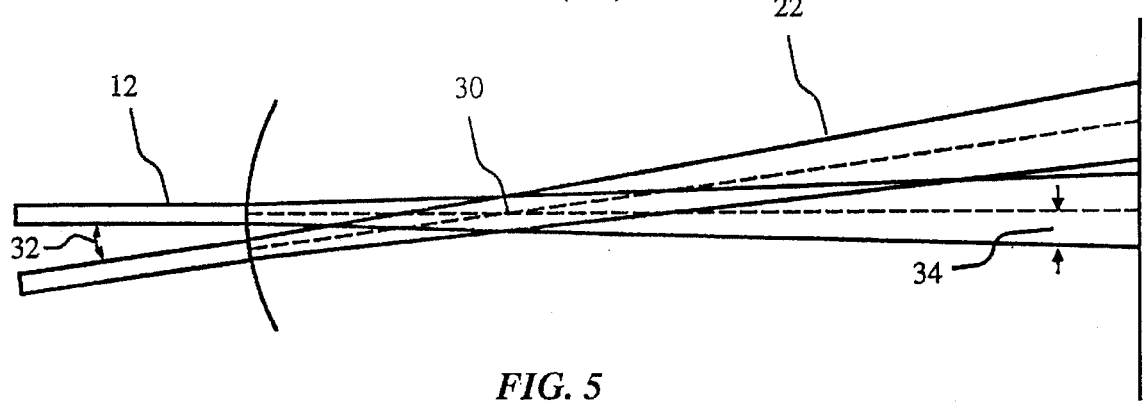
FIG. 5 shows a lasing cavity arrangement where the angle between the directions of adjacent cavities is larger than the angular spread of a laser beam, according to the invention.
Figure 6:
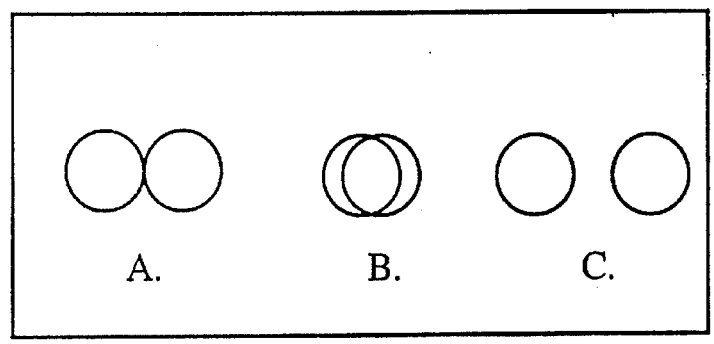
FIG. 6-A shows the relative positions of the far-field intensity distributions due to beams emerging from adjacent cavities for an arrangement where the angular displacement between adjacent cavities is equal to the far-field spreading angle of a laser beam, according to the invention.

FIG. 5 shows two main parameters of interest for the design of lasing cavity arrangements: the angular displacement 32 between adjacent cavities with respect to central point 30, and the far-field spreading angle 34 of individual laser beams. FIG. 5 shows a design where angular displacement 32 is larger than far-field spreading angle 34. FIG. 6 illustrates the dependence of the far-field pattern produced by two adjacent cavities on the relative magnitudes of angular displacement 32 and far-field spreading angle 34. The diameter of the spots is equal to the full-width at half-maximum of the laser beams. To make efficient use of the far-field, angular displacement 32 should be equal to far-field spreading angle 34; then the far-field spots from adjacent cavities will have the relative displacement shown in FIG. 6-A. If angular displacement 32 is smaller than far-field spreading angle 34, one can not resolve the far-field intensity peaks produced by adjacent cavities, as shown in FIG. 6-B; and if angular displacement 32 is larger than far-field spreading angle 34, one can not get quasi-continuous beam steering, i.e. there would exist far-field points that could not be addressed by any of the lasers, as shown in FIG. 6-C. Certainly, angular separation 32 between adjacent lasing cavities can be designed, if needed, to be smaller or larger than far-field spreading angle 34.

It is clear that due to the finite width of the lasing cavities, the contact pads similar to pad 20 cannot extend to geometric center 30. One design option is to keep the lasing cavities away from center 30. In the fan arrangement shown in FIG. 1–3, geometric center 30 is 45 μm away from the output facets of the lasers. This distance between center point 30 and the output facets gives a width of 6.3 μm for each of mirrors at the output facets, which is wide enough to avoid potentially large scattering losses at the mirror corners.

Figure 7:
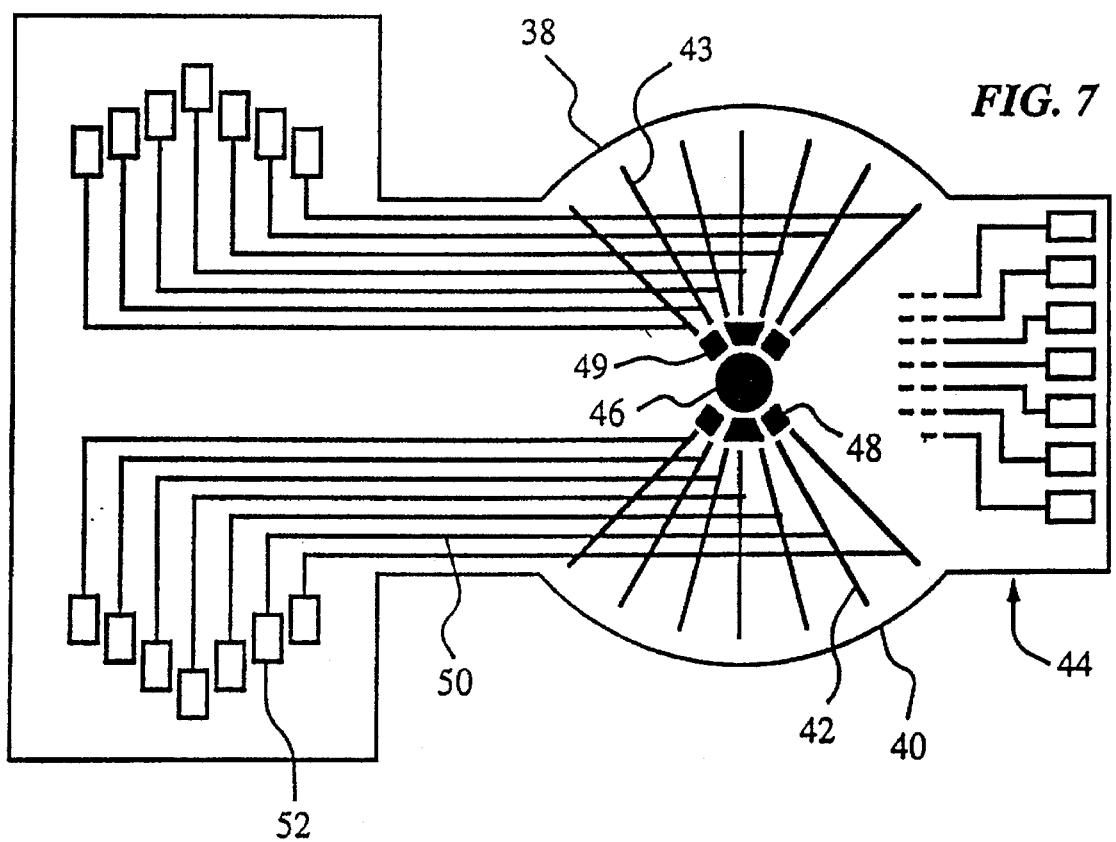
FIG. 7 shows a top view of a clock-like arrangement of the lasing cavities, outlining some of the electrical connections to the lasing cavities, according to the invention.

In the clock-like arrangement shown in FIG. 7, the common geometric center from which the cavities extend is inside the laser block. There is a front 38 and a back 40 mirror on two of the sides of a lasing cavity, and two p contact pads 42, 43 above the cavity, on the top side of the laser block 44; the n contact on the bottom side of block 44 is not shown. In this arrangement, the common geometric center is part of a lasing section common to all lasing cavities, and covered by a central contact pad 46. One can use intermediate contacts 48, 49 between contact pads 42, 43 and central pad 46, in order to reduce the pad-covered area that does not contribute to lasing. Lasing can be induced in a specific cavity by applying a voltage to its two individual pads 42, 43, their corresponding intermediate pads 48, 49, and central pad 46. The current interconnection 50 links contact pad 42 with its corresponding contact 52. Contact 52 is in electrical communication with a power supply (not shown). The interconnections linking pads 46, 48, 49 to their corresponding contacts similar to contact 52 are only partially shown, for simplicity.

The arrangements shown in FIG. 3 and 7 are only two examples of the kind of geometries that can be used for a far-field addressing apparatus similar to the one described above. FIGS. 8-A and 8-B show two alternative arrangements. Only the lasing cavities and the laser beams are shown in the figure; the beam spreading is not shown for simplicity. The geometric centers 54, 56 in FIG. 8-A and 58, 60 in FIG. 8-B are common to only some of the lasing cavities in each of the lasing blocks.

Figure 9:
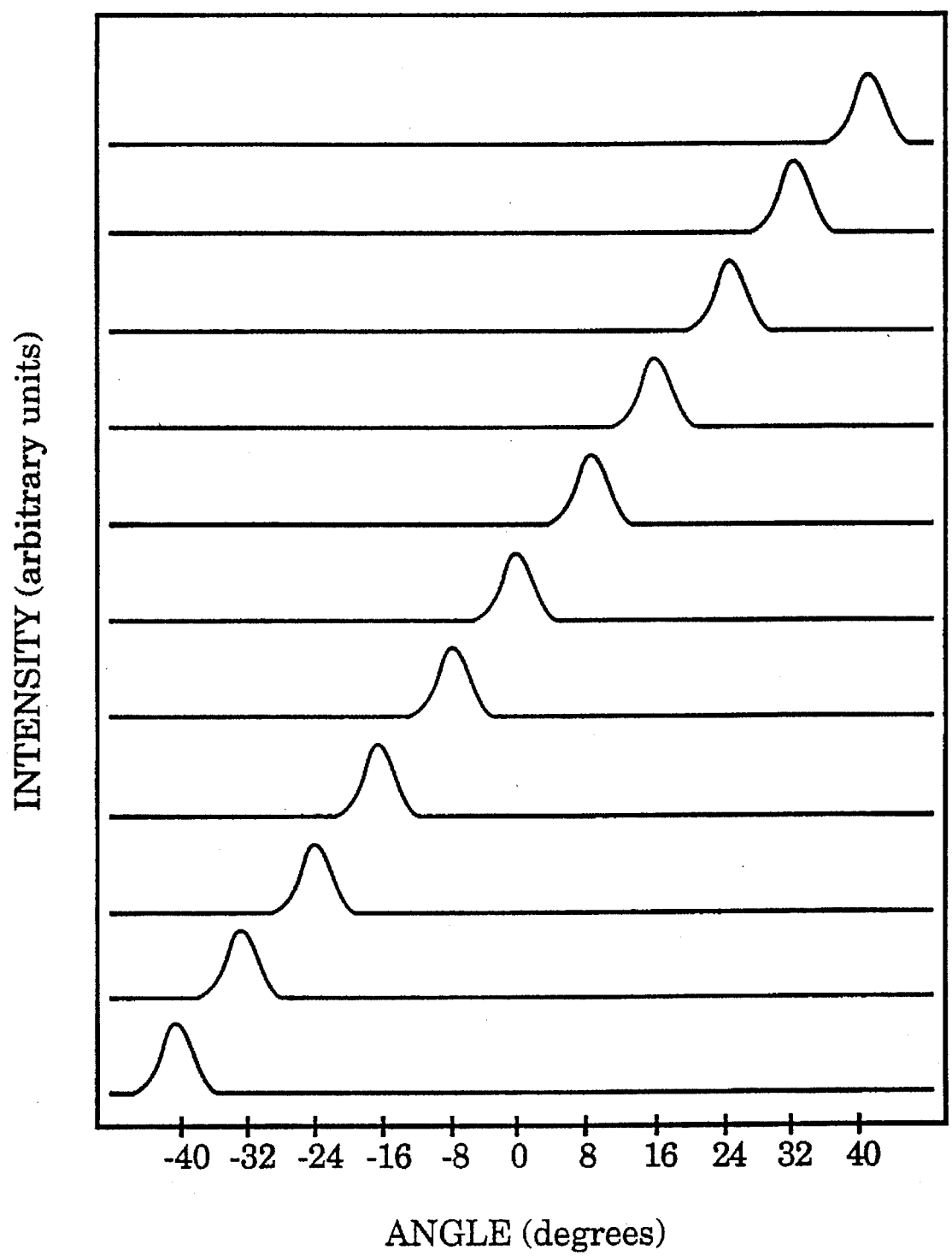
FIG. 9 shows the far-field intensity distributions from 11 lasing cavities 310 μm long in a fan-like arrangement, according to the invention.

To test the output of the lasers in the far field, a rotation stage with a slit and a photo detector is rotated around the lasing block 10. A 0.4 mm slit is placed 1 cm away from the output facets of the lasers, which gives an angular resolution of about 2° for the measurement. FIG. 9 shows the far field intensity distributions from a fan arrangement of 310 μm long laser cavities, where each laser is pumped with a current 1.2 times its lasing threshold. The intensity distributions are substantially Gaussian. The total steering angle is 80° and there are 11 resolvable spots, as designed.

SUMMARY, RAMIFICATIONS, AND SCOPE

There are many ways to build an apparatus similar to the ones described above, without departing from the spirit of the invention. By reducing the far-field angular spread of a single laser beam one can increase the number of resolvable spots, with additional lasers required for continuous addressing. The angular distribution of the laser cavity orientations can be uniform or non-uniform, different techniques can be used to fabricate the laser mirrors, and different insulation layers can be used for the interconnection wires. Pumping methods other than the application of a voltage, such as optical pumping, could also be used with a system similar to the one described above. Therefore, the scope of the invention should be determined not by the examples given, but by the appended claims and their legal equivalents.

We claim:

1. A semiconductor laser for broad-angle beam steering comprising:

a) a laser block having side walls;

b) a plurality of lasing cavities formed in said laser block, said lasing cavities extending radially from a common geometric center and being electrically insulated from each other, each of said lasing cavities terminating in a planar output facet oriented substantially normal to said lasing cavity and being formed in one of said side walls;

c) a multiplicity of contacts disposed on said laser block substantially along said lasing cavities, such that each of said lasing cavities is in electrical communication with at least one of said contacts; and d) a current source for applying a current in excess of a lasing threshold to a predetermined set of said contacts to induce lasing in at least one of said lasing cavities, thereby eliciting a laser beam out of at least one of said lasing cavities through said planar output facet terminating said lasing cavity.

2. The semiconductor laser of claim 1, wherein said contacts comprise conducting strips, each of said conducting strips being arranged in parallel with one of said lasing cavities.

3. The semiconductor laser of claim 2, wherein said lasing cavities are of the same length and said common geometric center lies outside said laser block.

4. The semiconductor laser of claim 2, wherein one of said conducting strips is disposed on each one of said lasing cavities, and each of said conducting strips extends substantially along the entire length of each of said lasing cavities.

5. The semiconductor laser of claim 2, wherein said common geometric center lies inside said laser block, and at least one of said contacts forms a central contact being in electrical communication with all of said lasing cavities.

6. The semiconductor laser of claim 5, wherein said central contact is located at said common geometric center.

7. The semiconductor laser of claim 1, wherein said lasing cavities have different emission wavelengths.

8. The semiconductor laser of claim 1, wherein the angles between said lasing cavities adjacent to each other are equal.

9. The semiconductor laser of claim 8, wherein the angles between said lasing cavities adjacent to each other have a value chosen in the range between 3 and 10 degrees.

* * * * *